United States Patent
Iwamoto et al.

(10) Patent No.: US 7,053,731 B2
(45) Date of Patent: May 30, 2006

(54) DUPLEXER USING SURFACE ACOUSTIC WAVE FILTERS

(75) Inventors: Yasuhide Iwamoto, Kawasaki (JP); Takashi Matsuda, Kawasaki (JP)

(73) Assignees: Fujitsu Media Devices, Limited, Yokohama (JP); Fujitsu Limited, Kawasaki (JP)

(*) Notice: Subject to any disclaimer, the term of this patent is extended or adjusted under 35 U.S.C. 154(b) by 15 days.

(21) Appl. No.: 10/826,368

(22) Filed: Apr. 19, 2004

(65) Prior Publication Data

US 2004/0212451 A1    Oct. 28, 2004

(30) Foreign Application Priority Data

Apr. 28, 2003  (JP)  ............... 2003-124385

(51) Int. Cl.
*H03H 9/72* (2006.01)
*H03H 9/64* (2006.01)

(52) U.S. Cl. ........................ 333/133; 333/193

(58) Field of Classification Search ........... 333/133
See application file for complete search history.

(56) References Cited

U.S. PATENT DOCUMENTS

| | | | | |
|---|---|---|---|---|
| 5,561,406 A | * | 10/1996 | Ikata et al. | 333/126 |
| RE37,375 E | * | 9/2001 | Satoh et al. | 333/193 |
| 6,351,194 B1 | * | 2/2002 | Takahashi et al. | 333/133 |
| 6,369,672 B1 | * | 4/2002 | Ikada | 333/193 |
| 6,466,103 B1 | * | 10/2002 | Iwamoto et al. | 333/133 |
| 6,489,860 B1 | * | 12/2002 | Ohashi | 333/133 |
| 6,501,344 B1 | * | 12/2002 | Ikata et al. | 333/133 |
| 6,606,016 B1 | * | 8/2003 | Takamine | 333/133 |
| 6,720,842 B1 | * | 4/2004 | Sawada | 333/133 |
| 6,756,864 B1 | * | 6/2004 | Muramatsu | 333/133 |
| 6,765,456 B1 | * | 7/2004 | Ehara et al. | 333/133 |
| 6,919,777 B1 | * | 7/2005 | Taniguchi et al. | 333/133 |
| 6,919,778 B1 | * | 7/2005 | Iwamoto et al. | 333/133 |
| 6,943,645 B1 | * | 9/2005 | Taniguchi | 333/133 |
| 2004/0155730 A1 | * | 8/2004 | Iwamoto et al. | 333/193 |

FOREIGN PATENT DOCUMENTS

| | | | |
|---|---|---|---|
| JP | 58-117701 | | 7/1983 |
| JP | 6-097761 | | 4/1994 |
| JP | 8-18393 | | 1/1996 |
| JP | 9-172340 | | 6/1997 |
| JP | 10-126213 | | 5/1998 |
| JP | 11-26623 | | 1/1999 |
| JP | 2002-141771 | * | 5/2002 |
| JP | 2002-237739 | | 8/2002 |
| JP | 2002-290204 | | 10/2002 |
| JP | 2003-032076 | | 1/2003 |
| JP | 2003-051731 | * | 2/2003 |
| JP | 2003-101385 | | 4/2003 |
| JP | 2004-80233 | | 3/2004 |

* cited by examiner

*Primary Examiner*—Barbara Summons
(74) *Attorney, Agent, or Firm*—Arent Fox PLLC

(57) ABSTRACT

A duplexer includes two surface acoustic wave (SAW) filters having different center frequencies, a phase matching circuit that matches phases of the two SAW filters, a package in which the SAW filters and the phase matching circuit are housed, the package having a die-attached layer on which a chip of the SAW filters is facedown mounted, and ground line patterns provided on the die-attached layer and an underlying layer that underlies the die-attached layer, the ground line patterns forming inductances.

17 Claims, 17 Drawing Sheets

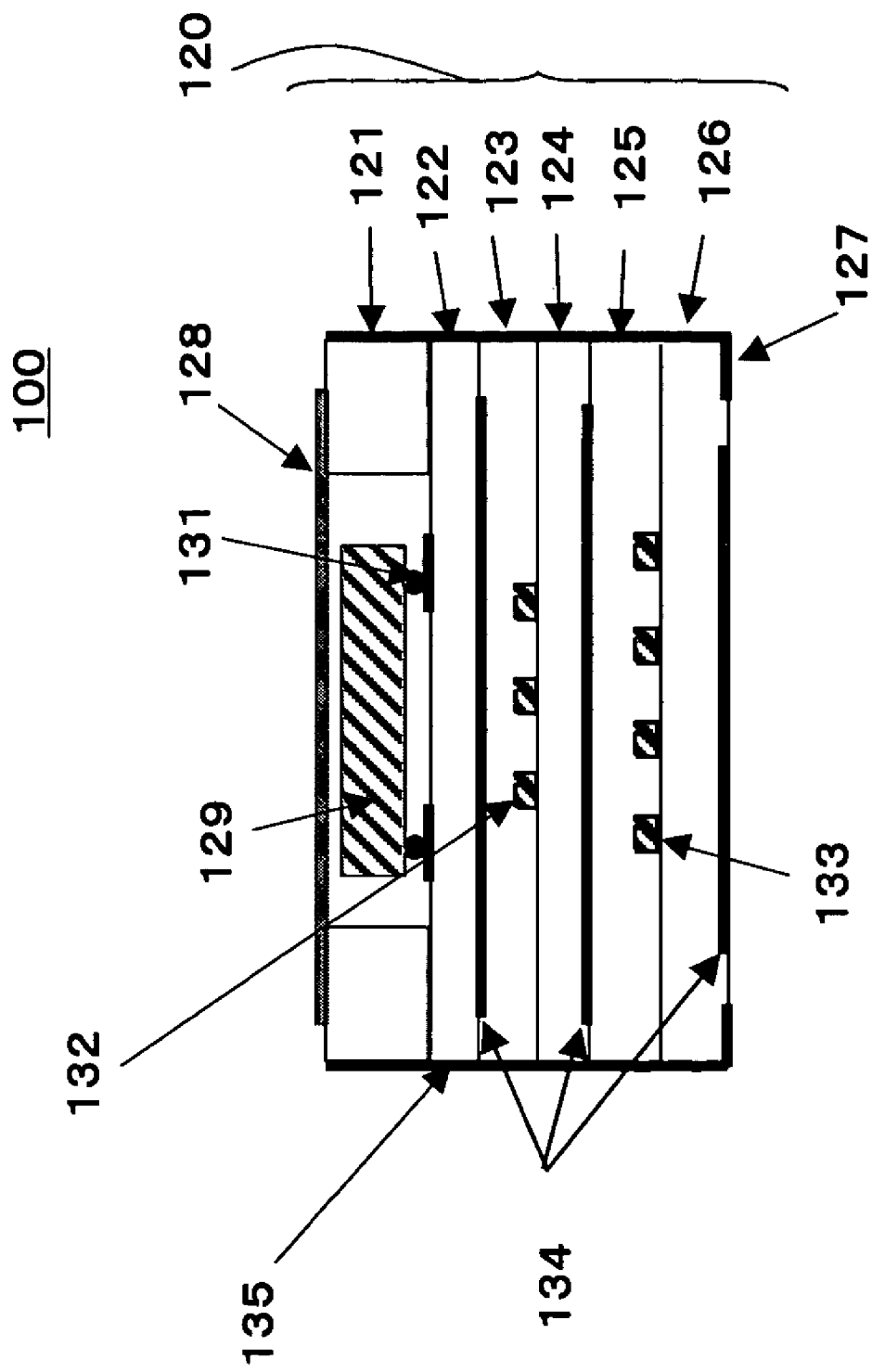

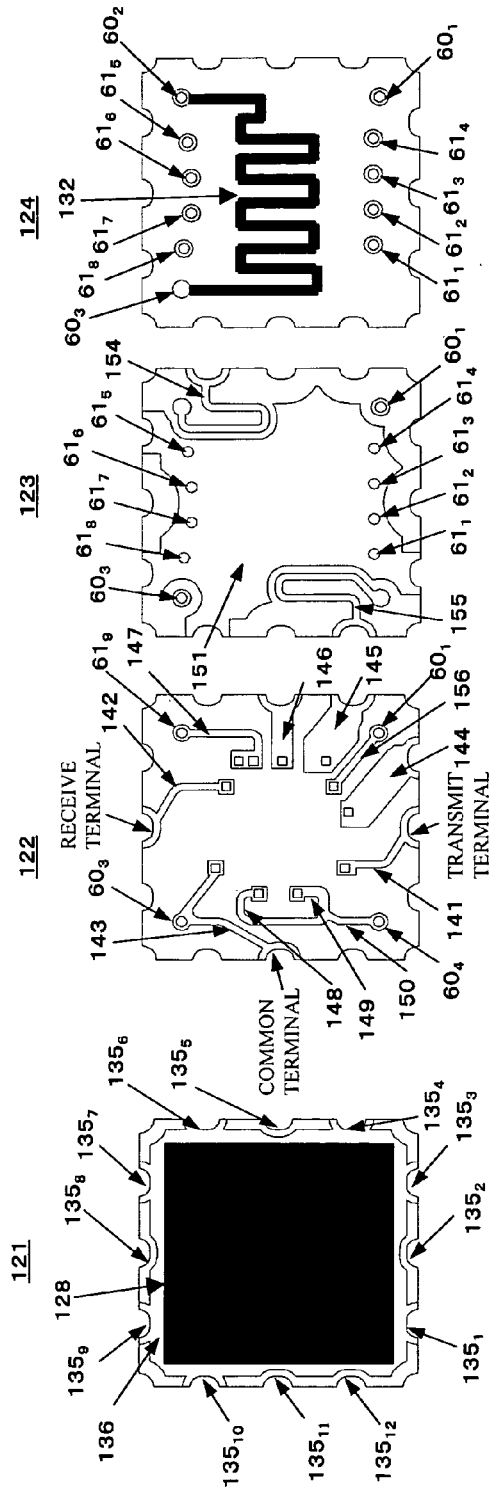

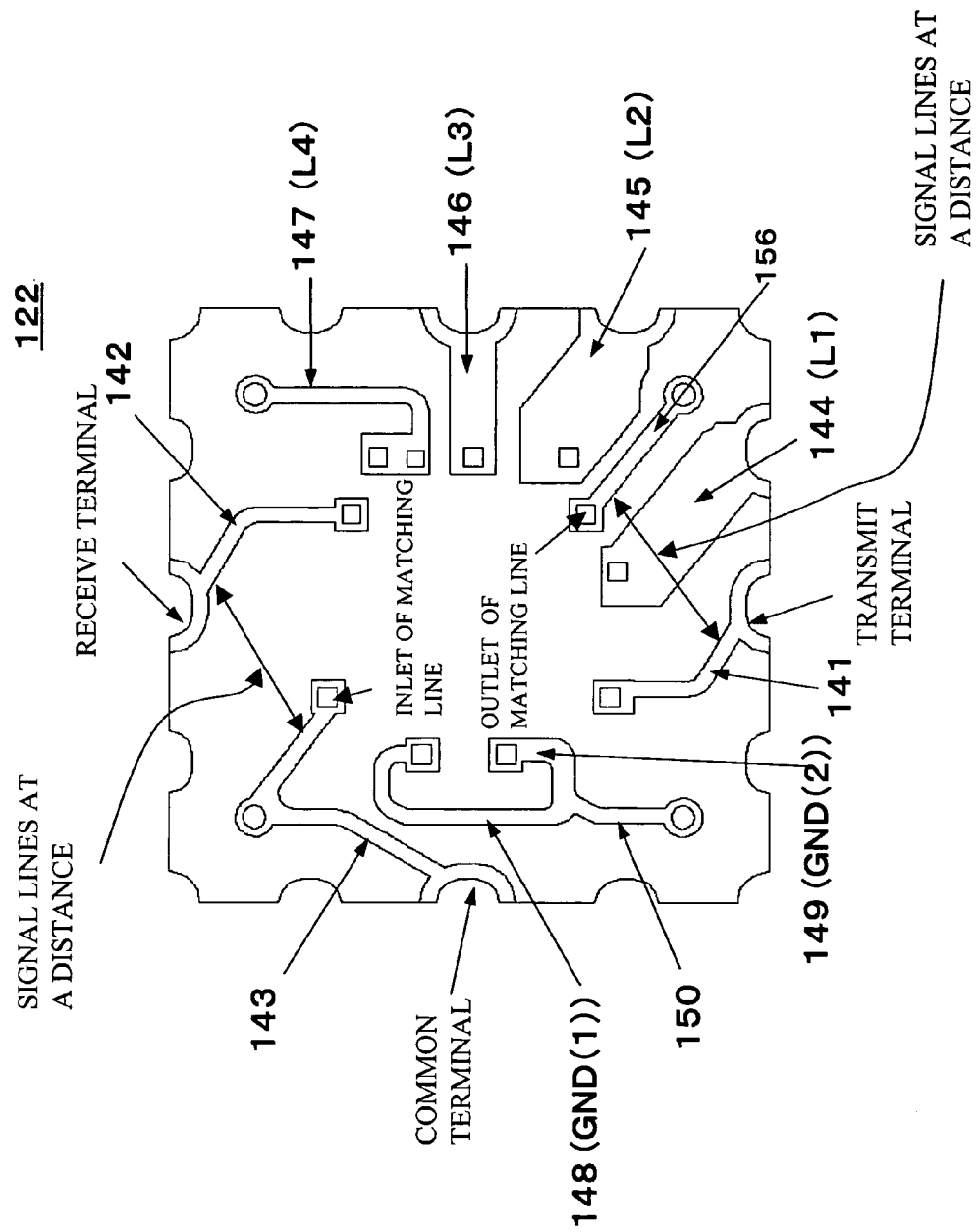

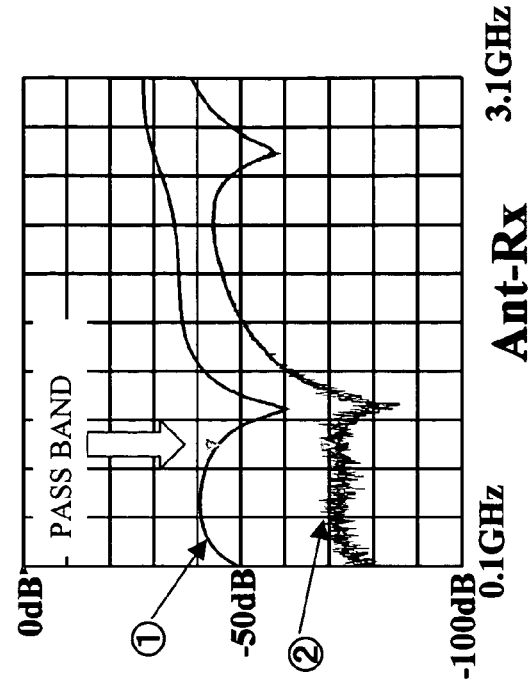
Fig. 12A  Tx-Ant
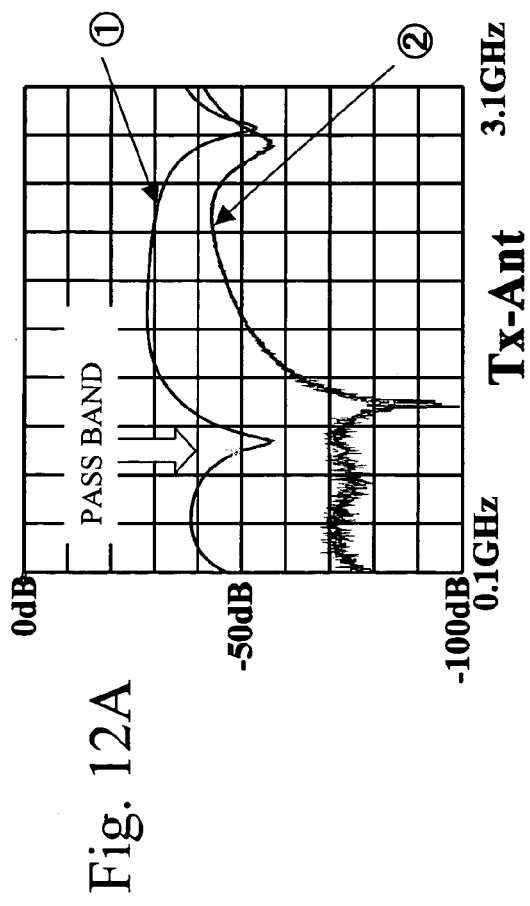
Fig. 12B  Tx-Rx
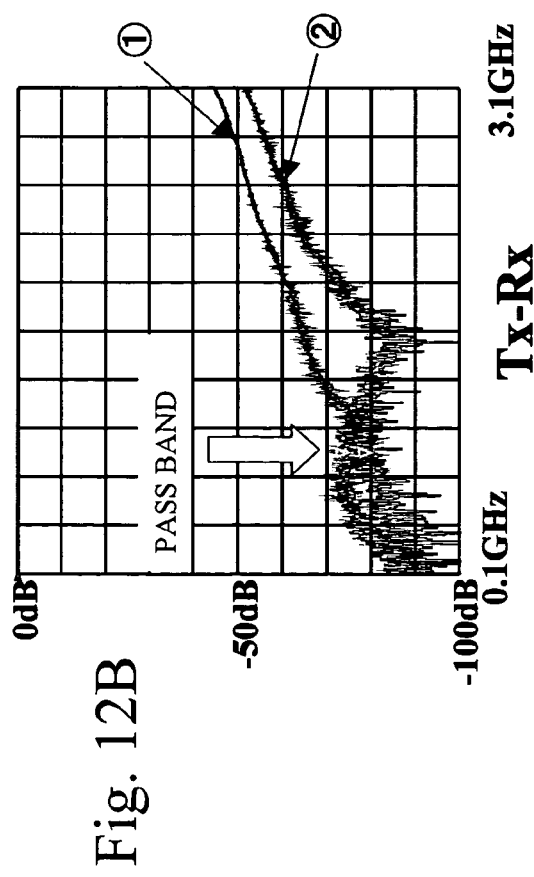
Fig. 12C  Ant-Rx
① NO GROUND BETWEEN TX/RX LINES AND PHASE MATCHING LINE
② GROUND EXISTS BETWEEN TX/RX LINES AND PHASE MATCHING LINE

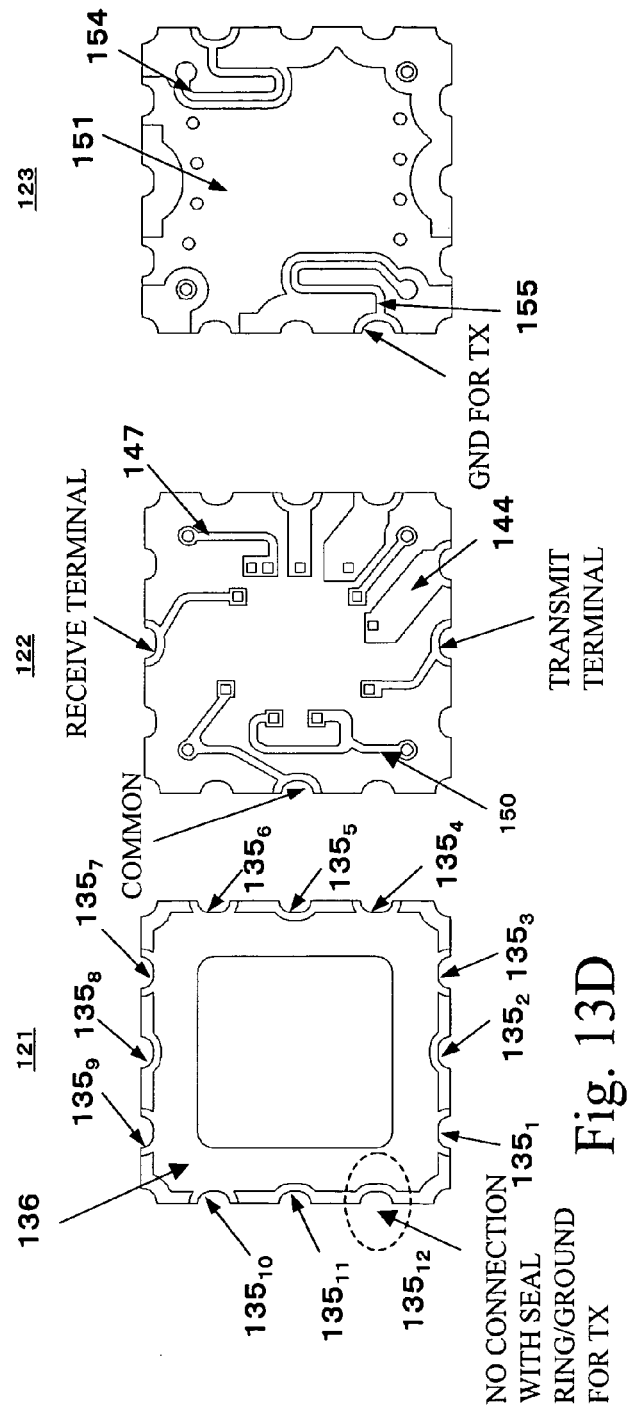

DUPLEXER USING SURFACE ACOUSTIC WAVE FILTERS

BACKGROUND OF THE INVENTION

1. Field of the Invention

The present invention generally relates to a duplexer using surface acoustic wave filters.

2. Description of the Related Art

Recently, cellular phones and portable information equipment have spread widely along with the development of mobile communications systems. It has been considerable activity in downsizing and improving the terminal equipment among many manufacturers. Some cellular phones deal with both the analog and digital systems and employ a variety of frequency bands such as the 800 MHz–1 GHz band and 1.5 GHz–2.0 GHz band.

The recent development of cellular phones is directed to expanding the terminal functions that follow diversified system specifications. For instance, there are dual-mode cellular phones having the analog and digital systems, and dual-frequency cellular phones conforming to TDMA (Time Division Multiple Access) and CDMA (Code Division Multiple Access). There are also dual-band cellular phones that handle two bands such as the combination of the 800 MHz band and the 1.9 GHz band, or the combination of the 900 MHz band and the 1.8 GHz or 1.5 GHz band. This trend requires improved performance of parts employed in these cellular phones, such as filters. It is also required to downsize the equipment and reduce the cost.

There are some types of antenna duplexers used in sophisticated terminal equipment. A dielectric type duplexer uses a dielectric for transmit and receive filters. A composite filter uses a dielectric for one to the transmit and receive filters and a surface acoustic wave (SAW) filter for the other. There is yet another type of duplexer that employs SAW filters only. The dielectric type duplexer has a relatively large size and has difficulty in downsizing and thinning the portable terminal equipment. The composite filter has the same problem as mentioned above.

The duplexer with SAW filters has a module type in which filters and a phase matching circuit are mounted on a printed-circuit board. An integral type has a ceramic multilayer package that houses the transmit and receive filters and the phase matching circuit. These filters have a volume approximately equal to ⅓ to ⅟₁₅ of that of the dielectric type duplexer and a height approximately equal to ½ to ⅓ of that. The downsized and thinned SAW duplexer can be produced at almost the same cost as the cost of producing the dielectric-type duplexer.

Further miniaturization of the SAW duplexer may be achieved by the use of a ceramic multilayer package as described in Japanese Patent Application Publication No. 10-126213, or by using a single chip on which two filters are mounted or employing the flip-chip mounting technique, which does not need bonding wires. Even when any of the means directed to further miniaturization, it is essential to employ a hermetically sealed package for housing the two filters and the phase matching circuit.

The facedown bonding contributes to downsizing. In contrast, the wire bonding restrains downsizing because it needs a large size particularly in height in order to arrange pads for wire bonding and prevent the wires from contacting a cap for hermetical seal. SAW duplexers that employ facedown bonding are proposed in Japanese Patent Application Publication No. 11-26623 or No. 2003-101385. However, these proposals are silent in how to reduce the influence of one filter characteristic to the other filter characteristic close thereto. It is desired that only a small influence as low as −40 dB to −50 dB be observed in the other filter.

Japanese Patent Application Publication No. 8-18393 discloses a line pattern sandwiched between ground layers for phase matching, the line pattern running on two layers of the package. The characteristic impedance of the strip line is designed to have a value greater than the characteristic impedance of an external circuit. However, this arrangement is required to have the distance between the line pattern and the ground patterns as long as possible in order to keep the characteristic impedance of the strip line higher than that of the external circuit. This requirement restrains downsizing. The ground layers that sandwich the line pattern are provided above footpads attached to the bottom of the package, so that there is difficulty in downsizing.

SUMMARY OF THE INVENTION

It is an object of the present invention to provide a downsized duplexer with improved out-of-band attenuation.

This object of the present invention is achieved by a duplexer comprising: two surface acoustic wave (SAW) filters having different center frequencies; a phase matching circuit that matches phases of the two SAW filters; a package in which the SAW filters and the phase matching circuit are housed, the package having a die-attached layer on which a chip of the SAW filters is facedown mounted; and ground line patterns provided on the die-attached layer and an underlying layer that underlies the die-attached layer, the ground line patterns forming inductances.

The above object of the present invention is also achieved by a duplexer comprising: a chip having first and second surface acoustic wave (SAW) filters having different center frequencies; a phase matching circuit that matches phases of the first and second SAW filters; and a package in which the first and second SAW-filters and the phase matching circuit are housed, resonators of the first and second SAW filters being arranged side by side in a SAW propagating direction, the chip having pads located further out than the resonators.

The present invention also includes an electronic apparatus equipped with a duplexer as mentioned above.

BRIEF DESCRIPTION OF THE DRAWINGS

Other objects, features and advantages of the present invention will become apparent from the following detailed description when read in conjunction with the accompanying drawings, in which:

FIG. 2 is a cross-sectional view of a package of the duplexer according to the embodiment of the invention;

FIGS. 4A, 4B, 4C, 4D, 4E, 4F and 4G show layers of the package of the duplexer shown in FIG. 2;

FIG. 5 is an enlarged view of a die-attached layer shown in FIG. 4B;

FIGS. 12A, 12B and 12C show package alone isolation between signals;

FIGS. 13A, 13B, 13C and 13D show layers of the package shown in FIG. 2;

DESCRIPTION OF THE PREFERRED EMBODIMENTS

Figure 1A:
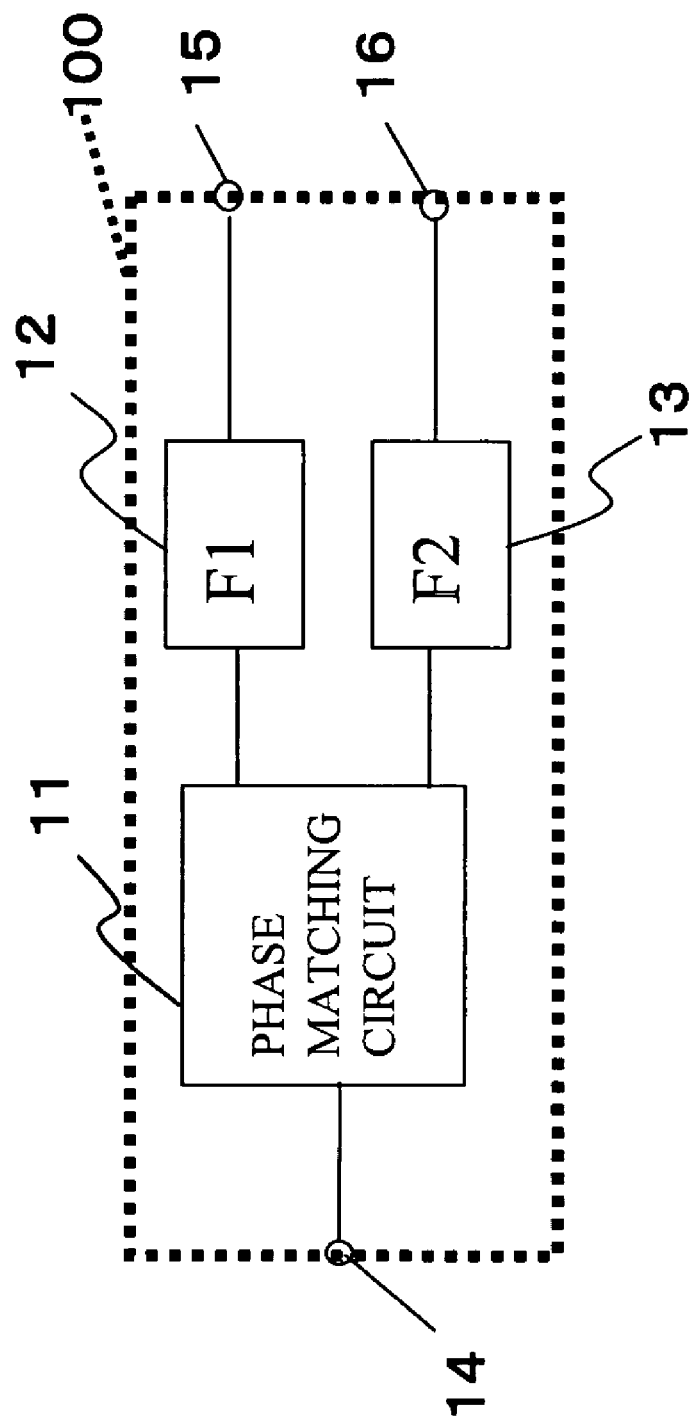
FIG. 1A is a block diagram of an outline of a duplexer according to an embodiment of the present invention.
Figure 1B:
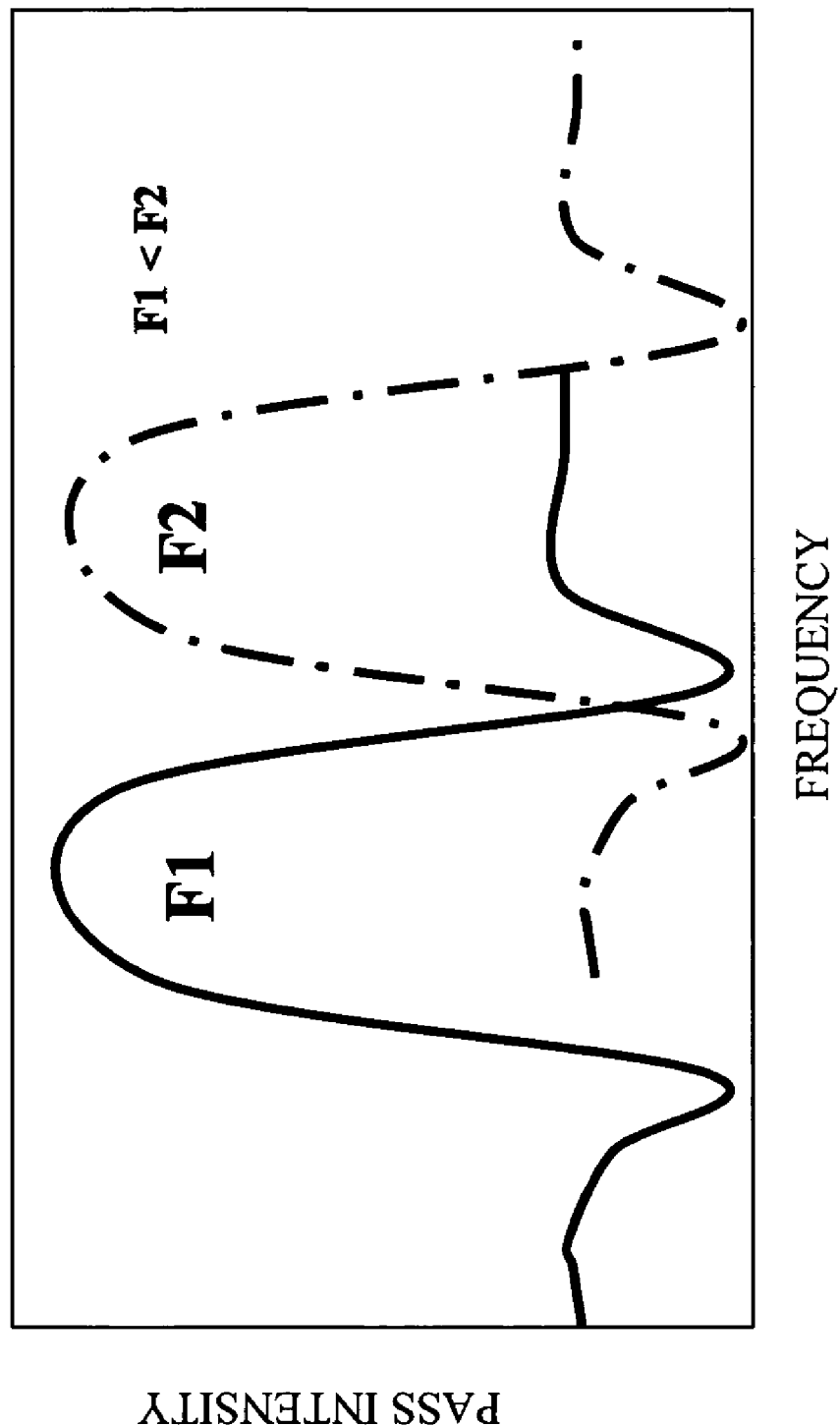
FIG. 1B is a graph of a frequency characteristic of the duplexer shown in FIG. 1A.

A description will now be given, with reference to FIGS. 1A and 1B, of the outline of a duplexer according to an embodiment of the present invention. FIG. 1A schematically shows a circuit configuration of a duplexer, and FIG. 1B shows a frequency characteristic of the duplexer. In FIG. 1B, the horizontal axis denotes the frequency that becomes higher as the position on the axis goes rightwards, and the vertical axis denotes the pass intensity that increases as the position on the axis goes upwards.

Referring to FIG. 1A, a duplexer 100 has two filters 12 (F1) and 13 (F2), a phase matching circuit 11, a common terminal 14, a transmit terminal 15 and a receive terminal 16. The common terminal 14 is used to make a connection with an external circuit that receives and transmits waves via an antenna. The external circuit may be a transmission cable. The transmit terminal 15 is used to make a connection with a transmitter arranged outside of the duplexer 100. A transmit signal from the transmitter having a desired center frequency is applied to the duplexer 100 via the transmit circuit 15. The receive terminal 16 is used to make a connection with a receiver arranged outside of the duplexer 100. A received signal having a desired center frequency is applied to the receiver from the duplexer 100 via the receive terminal 16. The filters 12 and 13 and the phase matching circuit 11 are housed in a multilayer ceramic package. The filters 12 and 13 are respective SAW filters having different center frequencies F1 and F2 of the pass bands. For example, the filter 12 is a transmit filter and the filter 13 is a receive filter. In this case, the center frequency F2 of the receive filter is higher the center frequency F1 of the transmit filter. The 1.9 GHz-band duplexer has only a frequency difference of about 100 MHz between F1 and F2.

The phase matching circuit 11 is provided to restrain interference between the filters 12 and 13. It is now assumed that Z1 denotes the characteristic impedance obtained by viewing the filter 12 from the common terminal 14, and Z2 denotes the characteristic impedance obtained by viewing the filter 13 from the common terminal 14. Due to the function of the phase matching circuit 11, when the signal input from the common terminal 14 has the frequency F1, the characteristic impedance Z1 on the side of the filter 12 is equal to the characteristic impedance of the common terminal 14, while the characteristic impedance on the side of the filter 13 is infinite and the reflection coefficient is equal to 1. When the signal input from the common terminal 14 has the frequency F2, the characteristic impedance Z2 on the side of the filter 13 is equal to the characteristic impedance of the common terminal 14, while the characteristic impedance on the side of the filter 12 is infinite and the reflection coefficient is equal to 1.

Figure 3B:
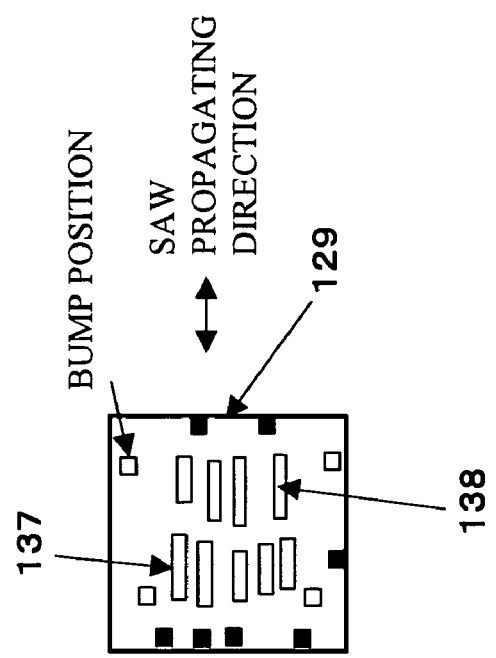
FIG. 3B is a plan view of a filter chip of the duplexer shown in FIG. 2.
Figure 3A:
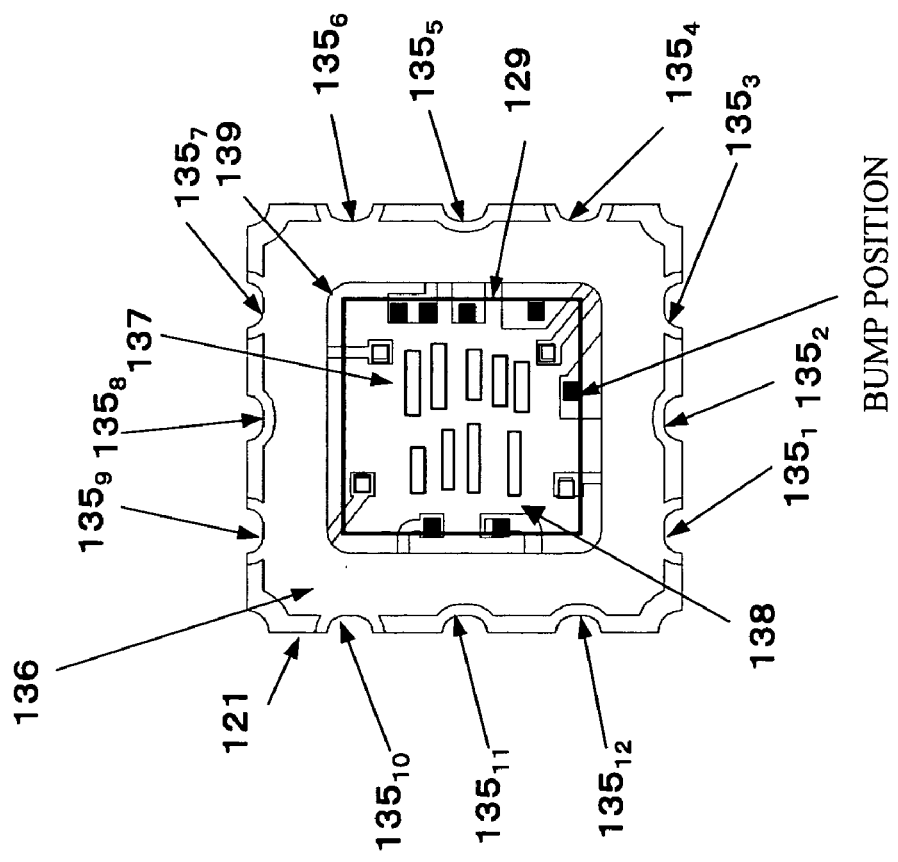
FIG. 3A is a plan view of the duplexer shown in FIG. 2 from which a cap has been removed.

FIG. 2 is a cross-sectional view of a duplexer according to an embodiment of the present invention. FIG. 3A is a plan view of the duplexer, and shows a package from which a cap has been removed. FIG. 3B shows a main surface of a filter chip housed in the package.

Referring to FIG. 2, the duplexer 100 has a laminate package 120, a cap 128, a filter chip 129, phase matching line patterns 132 and 133, and connection paths (side castellations) 135.

The laminate package 120 has a multilayer structure composed of six layers 121–126. The layer 121 is a cap mounting layer. The layer 122 is a die-attached layer. The layer 123 is a ground layer. The layer 124 is a phase matching line pattern layer. The layer 125 is a ground layer. The layer 126 is a phase matching line pattern layer/footpad layer.

The layers 121 through 126 of the laminate package 120 may be made of alumina ceramics or glass ceramics having a dielectric constant ($\epsilon$) of approximately 8 to 9.5. For example, the laminate package 120 has a size of 3.8 mm×3.8 mm×1.4 mm wherein "1.4 mm" is the thickness.

The filter chip 129 has a piezoelectric substrate on which comb-like electrodes, reflections and wiring patterns connected to the comb-like electrodes to form filter circuits. The filter chip 129 has two filters 12 and 13 shown in FIG. 1. For example, the transmit filter 12 is formed by a ladder-type SAW filter, and the receive filter 13 is formed by another ladder-type SAW filter. The ladder-type SAW filter includes multiple one-port SAW resonators, which are connected in a ladder fashion. FIGS. 3A and 3B schematically illustrate the SAW resonators, in which SAW resonators involved in the transmit filter 12 are indicated as transmit resonators 138 and SAW resonators involved in the receive filter 13 are indicated as receive resonators 137. The piezoelectric substrate of the filter chip 129 may be a piezoelectric single crystal of lithium tantalate ($LiTaO_3$), which may be a 42° Y-cut X propagation substrate. The comb-like electrodes, reflectors and wiring patterns on the piezoelectric substrate are made of an electrically conductive material. For example, a metal or alloy layer or a laminate of alloy layers are formed on the piezoelectric substrate by sputtering and are photolithographically exposed and etched. The alloy may contain Al as the main composition such as Al—Cu or Al—Mg. The laminate may be Al—Cu/Cu//Al—Cu, Al/Cu/Al, Al/Mg/Al, Al—Mg/Mg/Al—Mg. The transmit filter 12 and the receive filter 13 may be formed on separate piezoelectric substrates.

The cap mounting layer 121 defines a stepwise portion in the package. A space defined by the stepwise portion defines a cavity that houses the filter chip 129, which is mounted in the cavity in the facedown state (flip-chip mounting).

The cap 128 is attached to the top of the cap mounting layer 121. The cap 128 hermetically seals the filter chip 129 in the cavity. The cap 128 may have Au plating or Ni plating. The laminate package 120 have grooves $135_1$–$135_{12}$ on the side surfaces, each of which grooves has a half-cycle cross section. In the following, the grooves $135_1$–$135_{12}$ will also be assigned a reference numeral 135 unless a specific groove is referred to. Each of the four side surfaces of the laminate package 120 has three grooves 135. The grooves 135 run from the cap mounting layer 121 to the phase matching line pattern/foot pattern layer 127. A conductive layer is provided to each groove 135, so that a connection path (side castellation) can be defined. The connection paths will also be assigned the reference numeral 135. The connection paths 135 make interlayer connections and serve as terminals for making external connections.

The die-attached layer 122 defines the mounting surface on which the filter chip 129 is mounted, and provides a region for forming various wiring patterns. The filter chip 129 is connected to pads on the die-attached layer 122 by means of bumps 131 on the pads. The bumps 131 may be Au bumps.

Ground patterns 134 are formed on the upper surfaces of the ground layers 123 and 125. The ground patterns 134 cover large parts of the upper surfaces of the ground layers 123 and 125.

The phase matching line patterns 132 and 133 are provided on the upper surfaces of the phase matching line pattern layers 124 and 126. The patterns 132 and 133 form the phase matching circuit 11 shown in FIG. 1. The line patterns 132 and 133 for phase matching run on the two layers, so that a desired inductance value can be obtained nevertheless the package 120 is considerably downsized. The line patterns 132 and 133 have a width of approximately 80 μm to 120 μm, and serve as strip lines together with the ground patterns 134. The phase matching line patterns 132 and 133 may be made of a conductive material that contains copper (Cu), silver (Ag), or tungsten (W) as the major component. The line patterns 132 and 133 may be formed by depositing conductive films on the layers 124 and 126 and are patterned by screen printing or the like.

The footpads 127 are terminals for making external connections and are provided on the lowermost layer of the package 120. The footpads 127 serve as the common terminal 14, the transmit terminal 15 and the receive terminal 16 shown in FIG. 1. The lowermost layer of the package 120 is the phase matching line/footpad layer 126. The footpads 127 are connected to circuits in the duplexer 100 via the wiring lines 135 and/or vias formed in the laminate package 120. The footpads 127 include a pad that is not connected to the in-duplex circuits at all.

As shown in FIG. 3A, the filter chip 129, the cap mounting layer 121 and part of the die-attached layer 122 appear due to removal of the cap 128. FIG. 3A is illustrated so as to see through the filter chip 129 from above. A seal ring 136 is provided on the cap mounting layer 121. The seal ring 136 may be a Cu film plated with Ni or Au. The cap 128 is mounted on the seal ring 136. The cap mounting layer 121 has a window 139 located at the center thereof. The window 139 defines the cavity that houses the filter chip 129. The seal ring 136 is connected to the connection paths $135_2$, $135_5$, $135_8$ and $135_{11}$, located at the middle points on the side surfaces of the package 120 and the other connection paths except the path $135_{12}$.

FIGS. 4A through 4G show the respective layers of the package 120 of the duplexer 100. FIG. 4A shows the cap mounting layer 121, and FIG. 4B shows the die-attached layer 122. FIG. 4C shows the ground layer 123, and FIG. 4D shows the phase matching line pattern layer 124. FIG. 4E shows the ground layer 125. FIG. 4F shows the upper surface of the phase matching pattern/footpad layer 126, and FIG. 4G shows the lower surface thereof. FIG. 5 is an enlarged plan view of the die-attached layer 122.

The cap mounting layer 121 shown in FIG. 4A has the window 139 at the center thereof. The window 139 appears by removing the cap 128.

The filter chip 129 is flip-chip mounted on the die-attached layer 122 shown in FIGS. 4B and 5.

Now, for the sake of convenience, a description will be given of the bottom of the phase matching line pattern/footpad layer 126 shown in FIG. 4G. The bottom of the layer 126 is the mount surface of the duplexer 100. The mount surface of the duplexer 100 is mounted on a circuit board (not shown). On the mount surface, there are provided a transmit footpad $127_1$, a receive footpad $127_2$ and a common terminal footpad $127_3$ respectively connected to the connection paths $135_2$, $135_8$ and $135_{11}$ (see FIG. 4A). The footpads may be called foot castellations. The footpads $127_1$, $127_2$ and $127_3$ serve as external connection terminals, via which electrical connections with electrodes on the circuit board can be made. The transmit footpad $127_1$ corresponds to the transmit terminal 15 of the duplexer 100 shown in FIG. 1, and the receive footpad $127_2$ corresponds to the receive terminal 16. The common footpad $127_3$ corresponds to the common terminal 14 of the duplexer 100.

Turning back to FIGS. 4B and 5, signal patterns 141, 142 and 143 and ground patterns 144, 145, 146, 147, 148, 149 and 150 are provided on the upper surface of the die-attached layer 122. The filter chip 129 is arranged so that the surface of the chip 129 on which the bumps 131 (FIG. 1) are provided faces the upper surface of the die-attached layer 122. The bumps 131 are electrically connected to the signal patterns 141–143 and the ground patterns 144-149. As shown in FIGS. 3A and 3B, the bonding pads are arranged in peripheral areas, so that the wiring lines can easily be routed.

Figure 6:
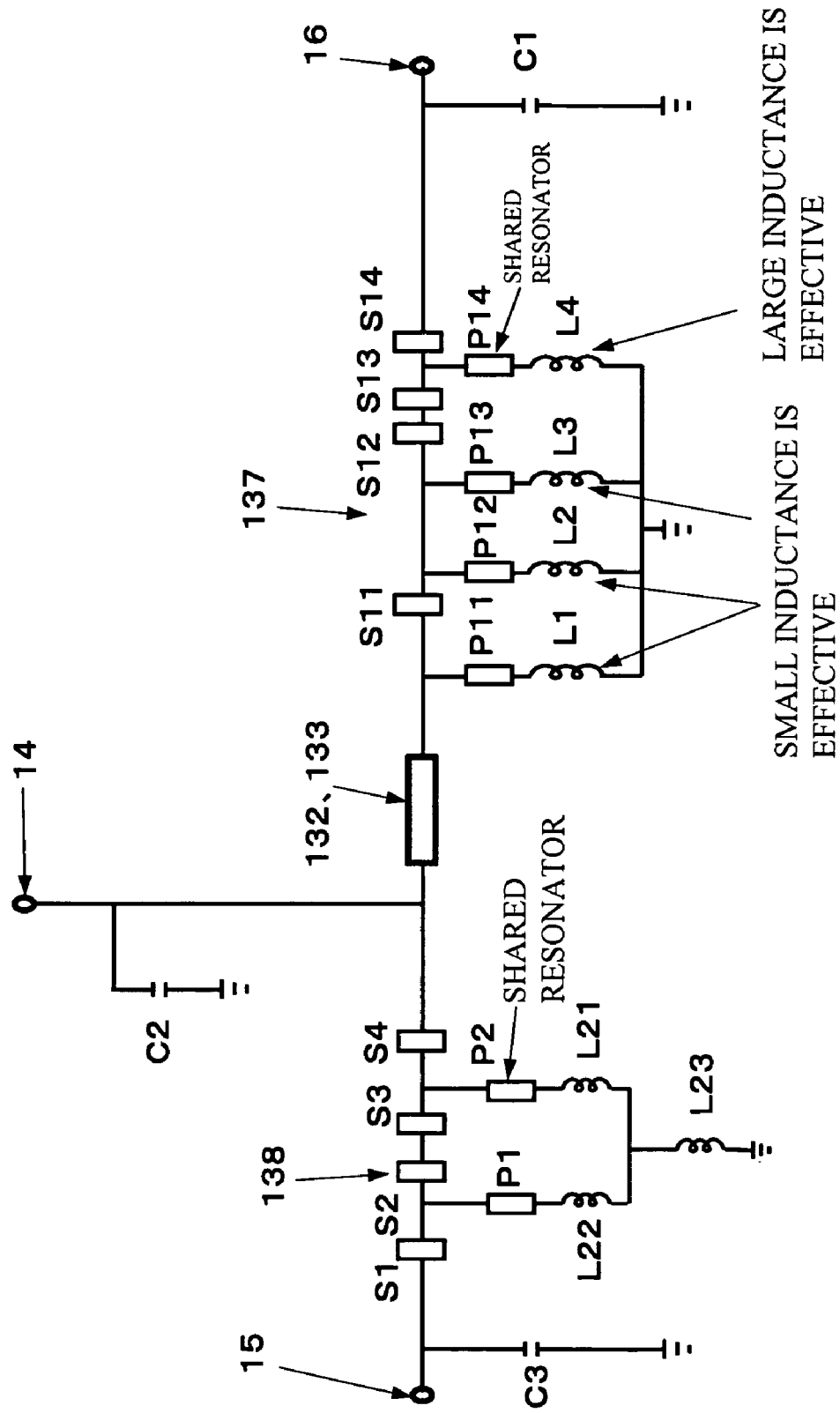
FIG. 6 is an equivalent circuit diagram of the duplexer shown in FIG. 2.

A further description of the die-attached layer 122 will now be described with reference to FIG. 6 in addition to FIGS. 4B and 5. FIG. 6 is a circuit diagram of the duplexer 100. The transmit filter 12 has multiple transmit resonators (one-port SAW resonators) connected so as to form a four-stage ladder arrangement. Four resonators S1–S4 are arranged in series arms, and two SAW resonators P1 and P2 are arranged in parallel arms. The resonators S1 and S2 in the series arms share the resonator P1 in the parallel arm. Similarly, the resonators S3 and S4 in the series arms share the resonator P2 in the other parallel arm. The receive filter 13 has multiple receive resonators (one-port SAW resonators) connected so as to form a five-stage ladder arrangement. Four resonators S11–S14 are arranged in the series arms, and four resonators P11–P14 are arranged in the parallel arms. The resonators S13 and S14 share the parallel resonator P14. Inductors L21 and L22 are connected in series to the resonators P1 and P2, respectively. An inductor L23 grounds the inductors L21 and L22. Inductances L1–L4 are connected in series to the parallel resonators P11–P14, respectively. The resonators P11-P14 are grounded via the inductors L1–L4, respectively. Symbols C1–C3 are parasitic capacitances.

Turning back to FIGS. 4B and 5, the transmit signal pattern 141 is connected to the footpad $127_1$ on the bottom of the layer 126 via the connection path $135_2$. The receive signal pattern 142 is connected to the receive footpad $127_2$ on the bottom of the layer 126 via the connection path $135_8$.

The common signal pattern 143 is connected to the common terminal pad $127_3$ on the bottom of the layer 126 via the connection path $135_{11}$. The ground wiring pattern 144 provides the ground for the receive filter 13, and is connected to the seal ring 136 shown in FIG. 4A and a ground pattern 153 shown in FIG. 4G via the connection path $135_3$. The ground wiring pattern 144 and the connection path $135_3$ form the inductance L1 via which the parallel resonator P11 is grounded.

The ground wiring pattern 145 provides the ground for the receive filter 13, and is connected to the seal ring 136 shown in FIG. 4A and the ground pattern 153 shown in FIG. 4G. The ground wiring pattern 145 and the connection path $135_4$ form the inductance L2 via which the parallel resonator P12 is grounded.

The ground wiring pattern 145 provides the ground for the receive filter 13, and is connected to the ground pattern 153 shown in FIG. 4G via the connection path $135_5$. The ground wiring pattern 146 and the connection path $135_5$ form the inductance L3 via which the parallel resonator P13 is grounded.

The ground wiring pattern 147 is connected, by means of a via $61_9$, to a ground wiring pattern 154 on the ground layer 123 below the die-attached layer 122 shown in FIG. 4C. The ground pattern 154 is connected to the seal ring 136 shown in FIG. 4A and a ground pattern 153 in FIG. 4G via the connection paths $135_6$. The ground wiring patterns 147 and 154 are the ground for the receive filter 13. The ground wiring patterns 147 and 154, the via $61_9$ and the connection path $135_6$ form the inductance L4 via which the parallel resonator P14 is grounded. The parallel resonator P14 is electrically composed of two resonators, which are physically unified. Thus, the inductance L4 is greater than the inductances L1 through L3, so that the out-of-band suppression can be improved. For instance, the inductance L4 as large as 1.3–1.8 nH is connected to the parallel resonator P14, while the inductances L1–L3 as small as 0.4–0.7 nH are connected to the parallel resonators P11–P13, respectively. This setting improves the out-of-band suppression.

The comparatively large inductance L4 can be provided by the long ground wiring lines that are formed by facedown mounting the filter chip 129 on the die-attached layer 122 and by using the ground pattern 147 on the die-attached layer 122 and the ground pattern 154 on the ground layer 123. It is to be noted that the large inductance L4 can be formed without any bonding wires.

The ground wiring pattern 148 provides the ground for the transmit filter 12, and is connected to the filter chip 129 via one end and to the ground wiring pattern 150 via the other end. The ground wiring pattern 148 forms the inductance L21 in the ground line via which the parallel resonator P2 is grounded.

The ground wiring pattern 149 provides the ground for the transmit filter 12, and is connected to the filter chip 129 via one end and to the ground wiring pattern 150 via the other end. The ground wiring pattern 149 forms the inductance L22 in the ground line. The ground wiring patterns 148 and 149 are connected at a node to which the ground wiring pattern 150 is connected. The ground wiring pattern 150 is connected to the ground wiring pattern 155 formed on the ground layer 123 shown in FIG. 4C via a via $60_4$. The ground wiring pattern 155 is connected to the ground pattern 153 shown in FIG. 4G via the connection path $135_{12}$. The ground wiring patterns 150 and 155, the via $60_4$ and the connection path $135_{12}$ form the inductance L23 in the ground line.

The inductances L21–23 can be provided by the long ground wiring lines that are formed by facedown mounting the filter chip 129 on the die-attached layer 122 and by using the ground patterns on the die-attached layer 122 and the ground patterns on the ground layer 123. It is to be noted that the inductances L21–L23 can be formed without any bonding wires.

The inductance values may be adjusted by changing the lengths of the ground wiring lines and/or widths thereof.

The phase matching line pattern 132 is formed on the phase matching line pattern layer 124 shown in FIG. 4D. The pattern 132 is not straight but bent at several points on the same plane in order to secure a desired length. The grounds of the strip line are provided by the ground patterns 151 and 152 respectively formed on the ground layers 123 and 125 (ground layers 134 in FIG. 2) located above and below the phase matching line pattern 132.

One end of the phase matching line pattern 132 is connected to the line pattern 143 for the common terminal on the die-attached layer 122 by the via $60_3$ formed in the ground layer 123 shown in FIG. 4C. One end of the line pattern 143 is connected to the filter chip 129, and the other end thereof is connected to the common terminal footpad $127_3$ on the bottom of the lowermost layer 126 via the connection path $135_{11}$. The other end of the phase matching line pattern 132 is connected to one end of the phase matching line pattern 133 on the lowermost layer 126 shown in FIG. 4F by the via $60_2$ that penetrates the ground layer 125 shown in FIG. 4E. The other end of the phase matching line pattern 133 is connected to the wiring pattern 156 on the die-attached layer 122 shown in FIG. 4B by the via $60_1$ that penetrate the ground layer 125 shown in FIG. 4E, the pattern layer 124 shown in FIG. 4D, and the ground layer 123 shown in FIG. 4C.

As shown in FIGS. 4D and 4F, preferably, the phase matching line pattern 132 located at the comparatively upper level and the phase matching line pattern 133 at the comparatively lower level have portions that cross each other. The presence of the crossing portions reduces the interference between the patterns 132 and 133. The characteristic impedance can be stabilized by a design such that the phase matching line pattern 133 at the lower level is longer than the pattern 132 at the upper level.

The seal ring (GND) 136 on the cap mounting layer 121 shown in FIG. 4A are connected to the ground patterns 151 and 152 shown in FIGS. 4C and 4E via the connection paths $135_1$, $135_7$, $135_9$ and $135_{10}$. The seal ring (GND) 136 on the cap mounting layer 121 shown in FIG. 4A and the ground pattern 153 shown in FIG. 4G are connected via the connection paths $135_1$, $135_3$, $135_6$, $135_7$, $135_9$ and $135_{10}$. The ground pattern 151 on the ground layer 123 shown in FIG. 4C and the ground pattern 152 shown in FIG. 4E are connected using the vias $61_1$–$61_8$. The ground pattern 152 on the ground layer 125 shown in FIG. 4E and the ground pattern 153 on the lowermost layer 26 shown in FIG. 4G are connected by the vias $61_2$, $61_3$, $61_6$ and $61_7$.

The ground wiring patterns 147 and 154 respectively formed on the die-attached layer 122 and the ground layer 123 are arranged above the phase matching line pattern 132 on the layer 124. Thus, the phase matching circuit 11 is covered by the ground plane from above, so that the characteristic impedance of the phase matching circuit 11 can be stabilized.

A description will now be given, with reference to FIGS. 7A and 7B, of the receive filter 13 of the duplexer shown in FIG. 6.

Figure 7A:
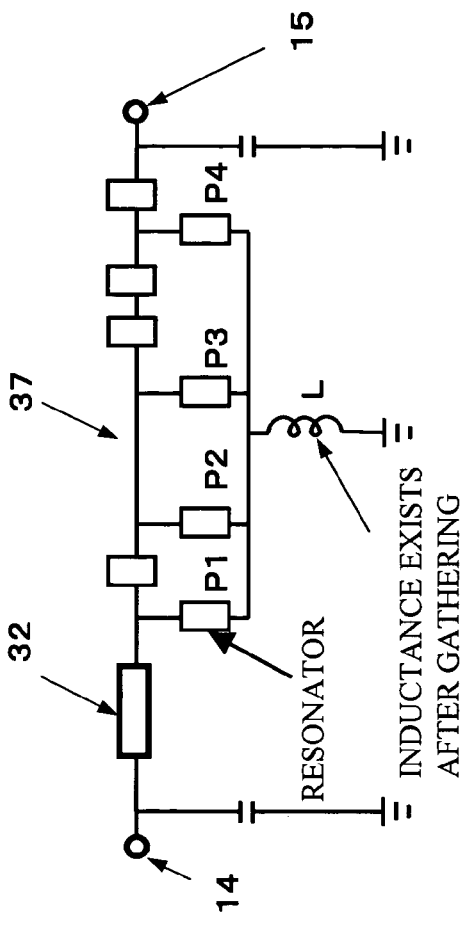
FIG. 7A is a circuit diagram of a receive system of a comparative duplexer.
Figure 7B:
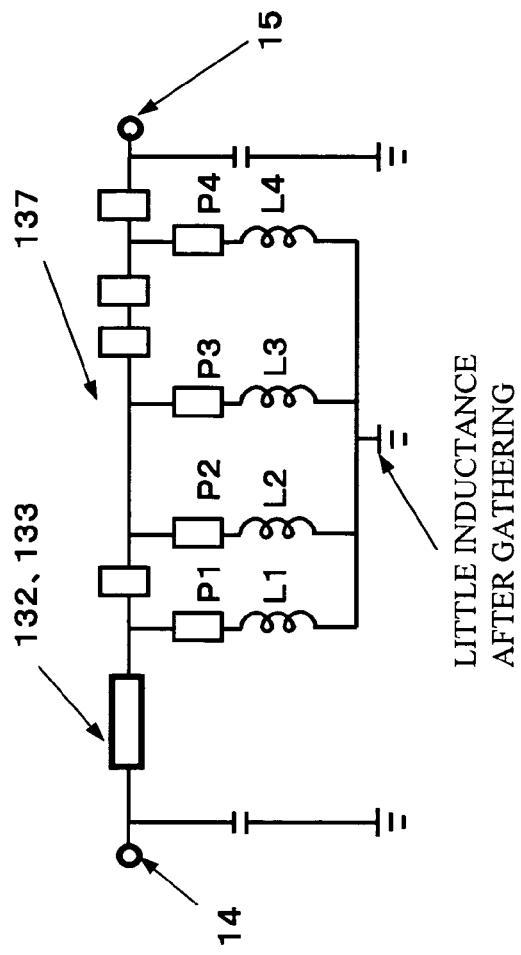
FIG. 7B is a circuit diagram of the receive system of the duplexer shown in FIG. 2.

FIG. 7A is a circuit diagram of the receive system of a comparative duplexer, and FIG. 7B is a circuit diagram of the receive system of the duplexer 100 according to the embodiment. The circuitry shown in FIG. 7B corresponds to the receive system shown in FIG. 6. Referring to FIG. 7A, the receive system has the common terminal 14, the receive terminal 15, a strip line 32 (phase matching line), and a group 37 of resonators. The receive system shown in FIG. 7B has the common terminal 14, the receive terminal 15, strip lines 132 and 133 (phase matching lines), and a group 137 of resonators. As shown in FIG. 7A, the comparative duplexer employs an arrangement such that the ground lines extending from the parallel resonators are connected together at a single node, which is then grounded via an inductance L. In contrast, the duplexer 100 has an arrangement such that the parallel resonators P1–P4 are connected to respectively inductances L1–L4 and are connected to the signal node that is grounded. It is to be noted that there is little inductance between the common node and ground. This unique ground arrangement shown in FIG. 7B brings about the following advantages.

Figure 8:
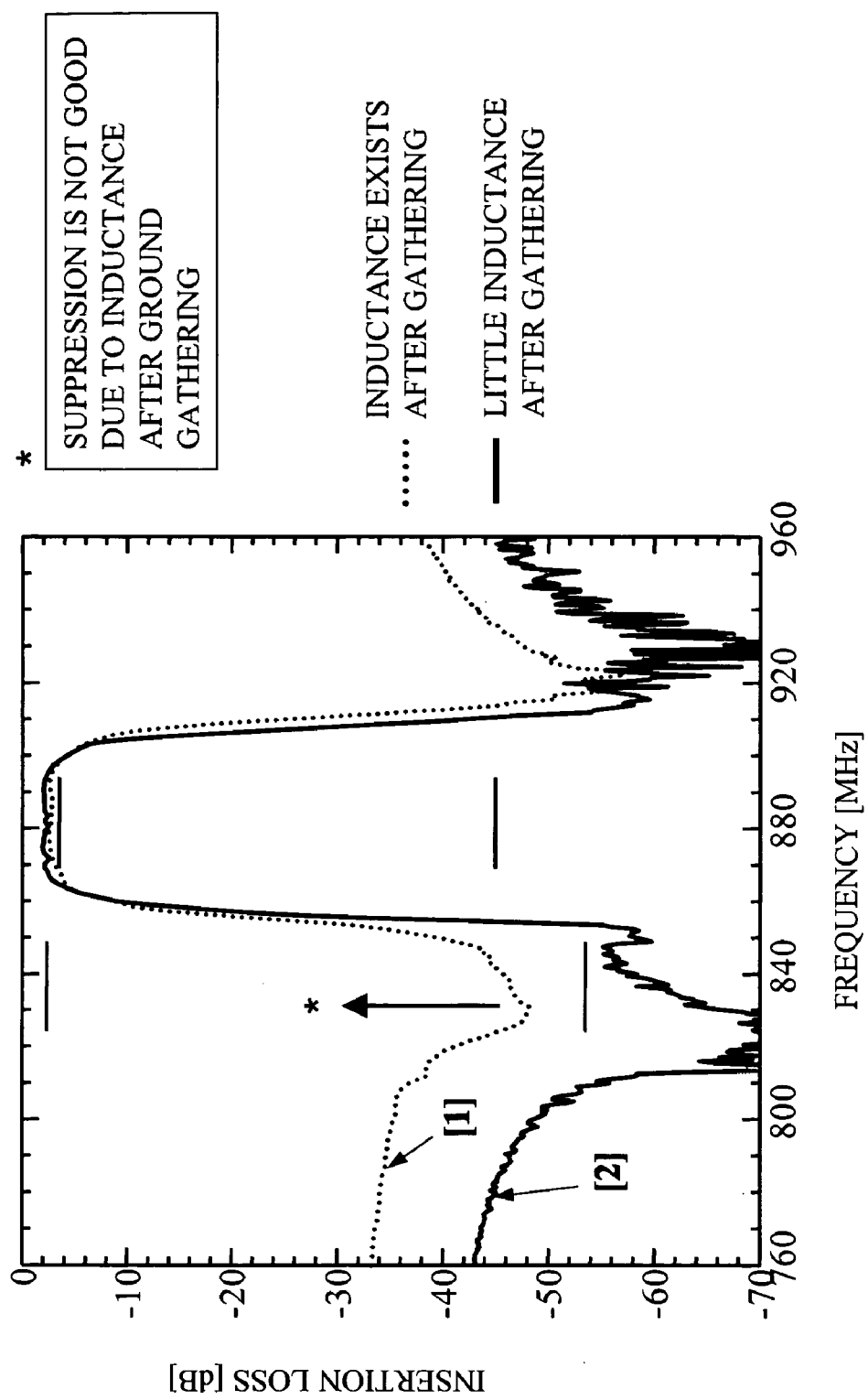
FIG. 8 is a graph of a filter characteristic of a receive filter of the duplexer shown in FIG. 2.

FIG. 8 is a graph of the filter characteristics of the comparative duplexer and the duplexer 100 according to the present embodiment. As indicated by [1], the comparative duplexer with the inductance connected between the common node and ground does not have a good poor out-of-band suppression. In contrast, the duplexer 100 without any inductance between the common node and ground has an improved out-of-band suppression. Particularly, the out-of-band suppression at the high-frequency side is drastically improved.

In FIG. 2, the three ground patterns 134 have an equal distance between the adjacent patterns. In contrast, as will be described as a variation of the embodiment, the ground patterns have different distances between different pairs of adjacent patterns. This unique arrangement brings about remarkable effects.

Figure 9:
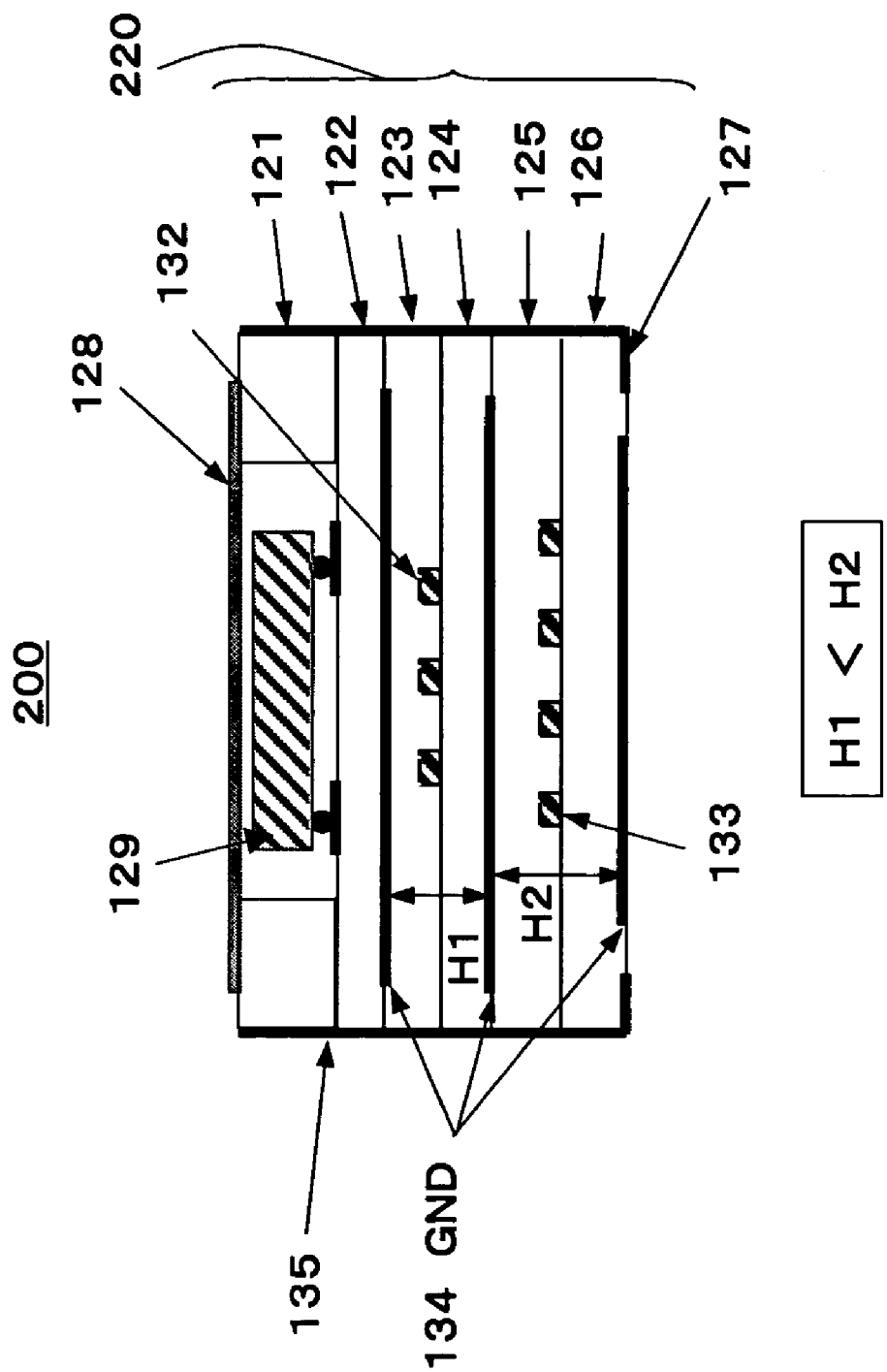
FIG. 9 is a cross-sectional view of a variation of the duplexer shown in FIG. 2.

FIG. 9 is a cross-sectional view of a variation of the aforementioned embodiment of the present invention, in which parts that are the same as those shown in the previously described figures are given the same reference numerals. A duplexer 200 shown in FIG. 9 has a laminate package 220, the filter chip 129, the phase matching line patterns 132 and 133 and the cap 128. The laminate package 220 is composed of the six layers 121–126 also employed in the aforementioned embodiment of the invention. The phase matching line patterns 132 and 133 are respectively formed on the layers 124 and 126, and are connected in series. This enables a large inductance value for phase matching.

In order to stabilize the characteristic impedance of the phase matching line, it should be sandwiched between the grounds. It is to be noted that the ground has a larger inductance than that of the footpad ground as the ground becomes away from the footpad 127 in the vertical or height direction. This results in a large variation in the characteristic impedance. The inventors found out that variation in the characteristic impedance can be reduced as the distance between the phase matching line pattern and the grounds located above and below the phase matching line pattern.

Figure 10:
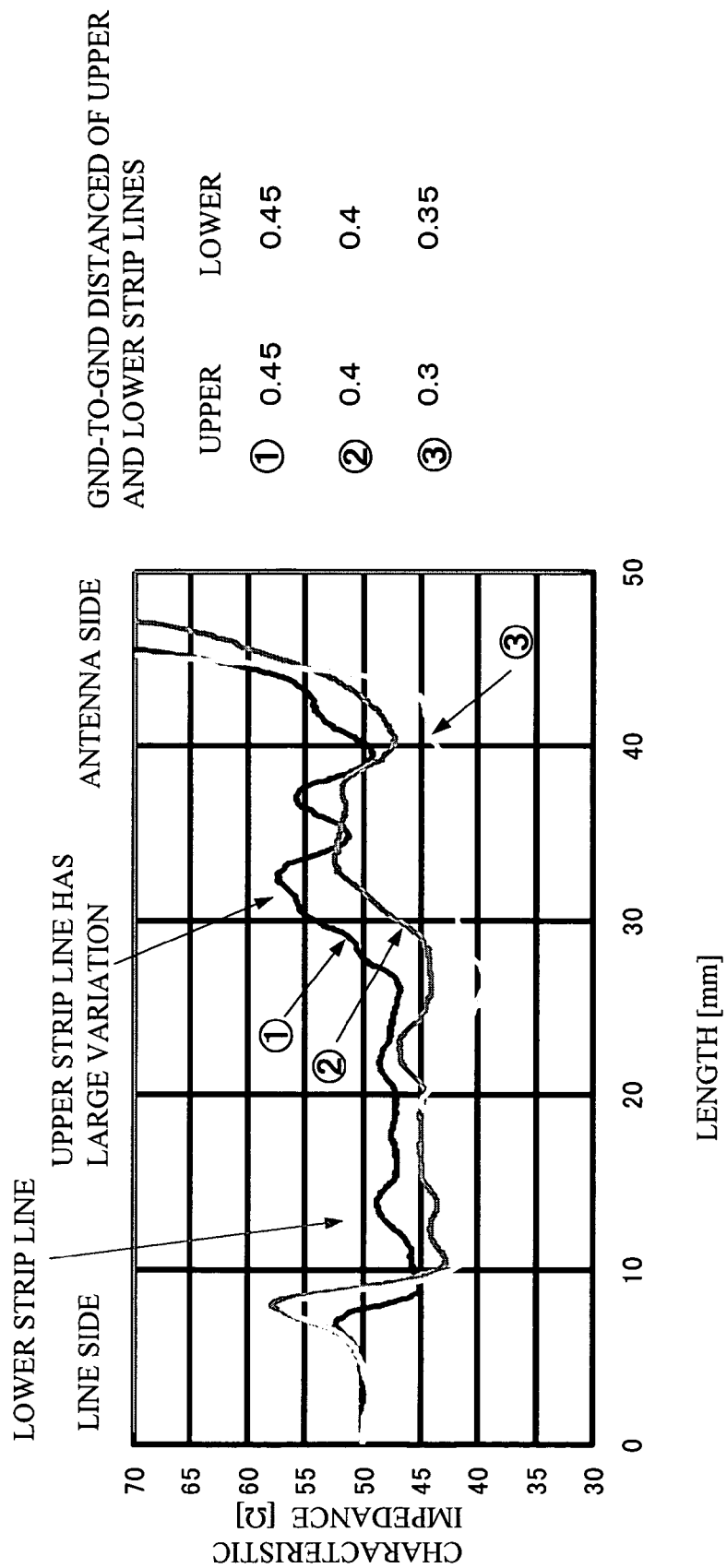
FIG. 10 illustrates variations in the characteristic impedance as a function of the ground-to-ground distances of strip lines.

FIG. 10 is a graph of variations of the characteristic impedance as a function of the ground-to-ground distances of upper and lower strip lines. The horizontal axis of the graph denotes the lengths of the strip lines, and the vertical axis denotes the characteristic impedance. As shown in FIG. 10, the lower strip line has a small variation in the characteristic impedance of the phase matching line. In contrast, the upper strip line has a large variation in the characteristic impedance of the phase matching line. It can be seen from the above experiments that the line-to-ground distance on the upper impedance matching line should be made smaller than that on the lower one, whereby the characteristic impedance of the phase matching line can be stabilized and the difference in the characteristic impedance between the lower and upper strip lines can be reduced. The stabilized characteristic impedance of the phase matching line reduces reflection caused in the line and improves insertion loss.

From the above viewpoints, the duplexer 200 shown in FIG. 9 is designed to meet H1<H2 where H1 denotes the distance between the upper and middle ground layers 134, and H2 denotes the distance between the middle and lower ground layers 134.

FIG. 10 also shows the phase matching lines 132 and 133 have a relatively small variation in the characteristic impedances when they have characteristic impedances lower than that of an external circuit, namely, 50 Ω. The characteristic impedance will become lower than 50 Ω by narrowing the upper and lower grounds with respect to each of the phase matching lines 132 and 133. This contributes to downsizing.

It is considered that a fluctuation of the characteristic impedance observed in the range of approximately 7 mm to 10 mm in FIG. 10 takes place due to an influence of the probe of the measuring apparatus. However, the real characteristic impedance in that range may be stable.

Figures 11A, 11B:
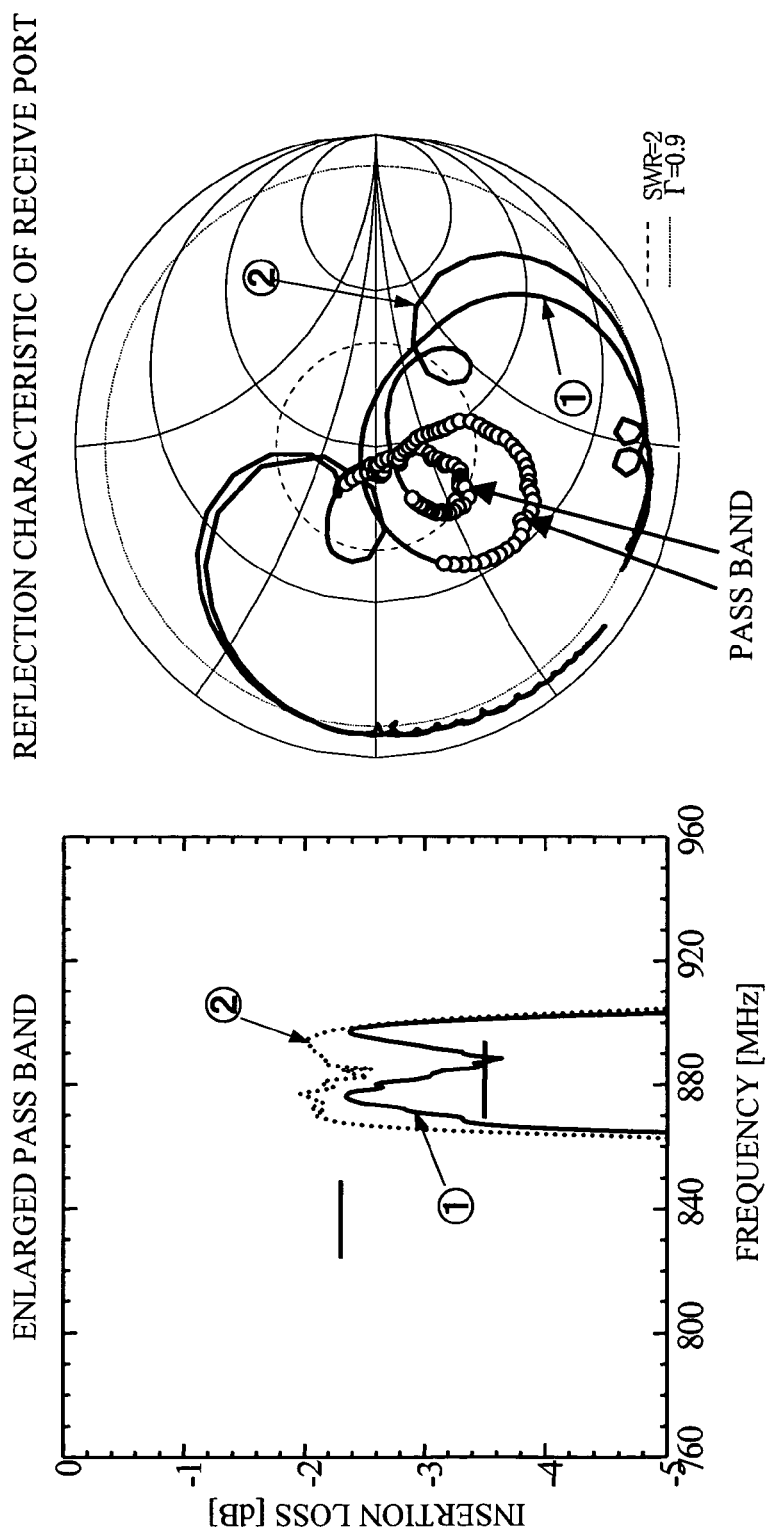
FIG. 11A is a graph of a filter characteristic of the duplexer shown in FIG. 2.
FIG. 11B is a graph of a reflection characteristic of a receive port of the duplexer shown in FIG. 2.

A description will now be given of the characteristic impedances of the phase matching line patterns 132 and 133 that form the phase matching circuit 11. More particularly, FIG. 11A shows a filter characteristic of the duplexer 100, and FIG. 11B shows a reflection characteristic of the receive terminal 16 (receive port). The horizontal axis of FIG. 11A denotes the frequency, and the vertical axis thereof denotes insertion loss. A symbol [1] shows the characteristics of the phase matching line when they are higher than the characteristic impedance of an external circuit. A symbol [2] shows the characteristics of the phase matching line when they are lower than the characteristic impedance of an external circuit.

As shown in FIG. 11A, when the characteristic impedance of the phase matching line patterns 132 and 133 is higher than that of the external circuit connected to the receive terminal 16, the duplexer 100 has a better insertion loss than that for the comparatively low case. As shown in FIG. 11B, when the characteristic impedance of the phase matching line patterns 132 and 133 is lower than that of the external circuit connected to the receive terminal 16, a ring of the pass band becomes smaller so that the impedance match can be improved.

The laminate package 120 has good terminal-to-terminal isolation. FIGS. 12A, 12B and 12C show package alone isolation between signals (in which the SAW chip is not mounted). More particularly, FIG. 12A shows the isolation between the transmit terminal 15 and the common terminal 14. FIG. 12B shows the isolation between the common terminal 14 and the receive terminal 16. FIG. 12C shows the isolation between the transmit terminal 15 and the receive terminal 16. In these figures, symbol [1] indicates the isolation of the comparative duplexer in which no ground is provided between the transmit signal pattern 141 (FIG. 4B) and the phase matching line patterns 132 and 133 and between the receive signal pattern 142 and the phase matching line patterns 132 and 133. Symbol [2] indicates the isolation of the duplexer according to the present embodiment in which the ground pattern 134 (the ground pattern 151 shown in FIG. 4C) is provided between the signal lines and the phase matching line patterns 132 and 133. The ground pattern 134 electrically isolates the transmit line 141 and the receive line 142 on the die-attached layer 122 from the phase matching line patterns 132 and 133, so that isolation can be greatly improved.

Figure 14:
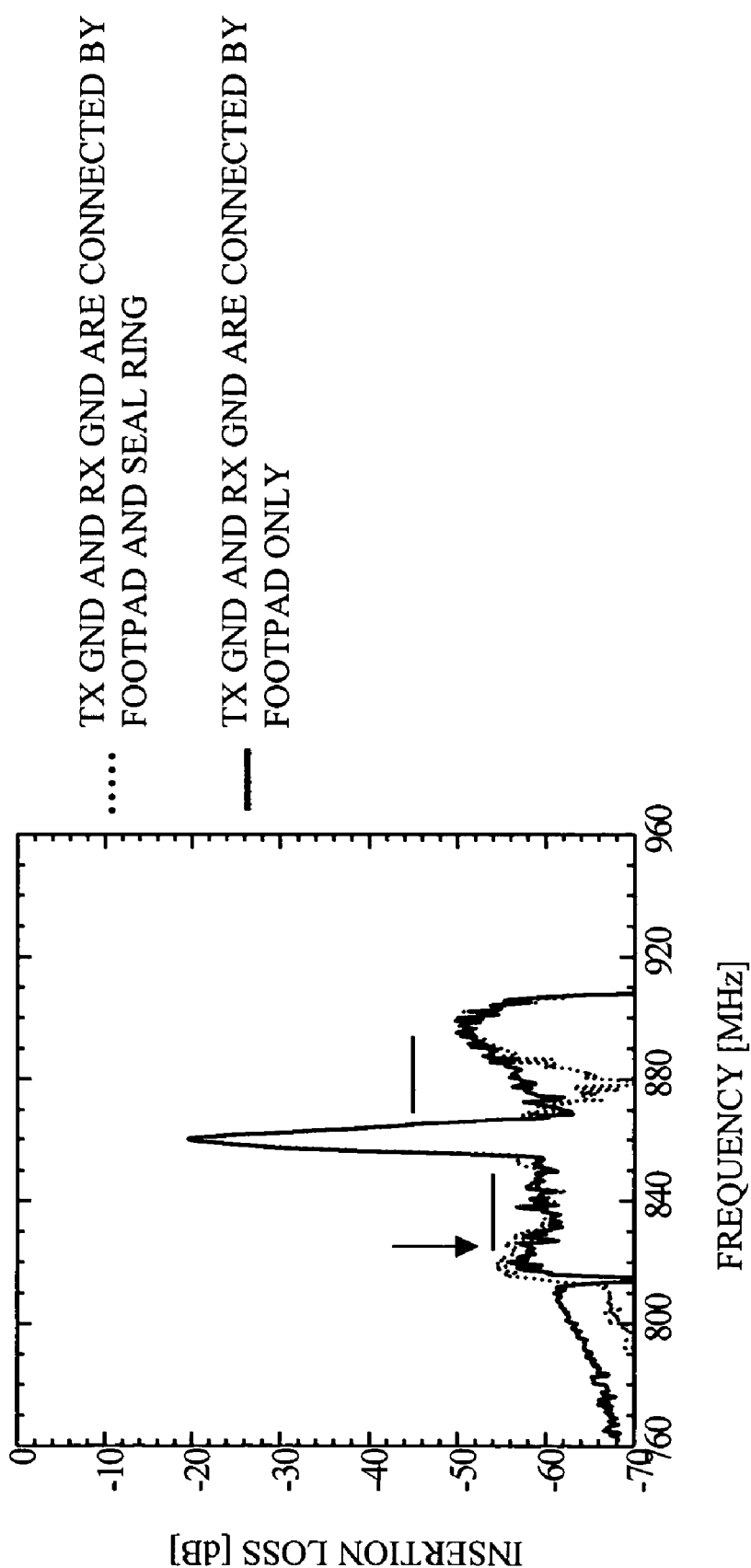
FIG. 14 is a graph of a filter characteristic of the duplexer shown in FIG. 2.

FIGS. 13A through 13D show some layers of the laminate package of the duplexer 100 according to the present embodiment. More particularly, FIG. 13A shows the cap mounting layer 121, and FIG. 13B shows the die-attached layer 122. FIG. 13C shows the ground layer 123, and FIG. 13D shows the footpad layer 126. The phase matching line pattern layer 124 and the ground layer 125 are omitted here. Although FIGS. 13A through 13D have already been illustrated in FIGS. 4A, 4B 4C and 4G, these figures are illustrated again in order to facilitate better understanding of the following description. As shown in FIGS. 13A through 13D, the transmit ground patterns 150 and 155 and the receive ground patterns 147 and 154 are connected together by only the footpad 153. For example, the transmit ground pattern 155 is connected to the connection path $135_{12}$, which is connected to only the ground pattern 153 formed on the footpad surface and is not connected to the seal ring 136 on the cap mounting layer 121 shown in FIG. 13A (see a circle of the broken line). That is, the transmit ground pattern 155 is connected to the receive ground via only the ground pattern 153 on the footpad surface. The way of connection with the transmit ground pattern 155 holds true for the transmit ground pattern 150 and the receive ground pattern 147 and 154. Thus, the isolation between the transmit system and the receive system can be improved as shown in FIG. 14 (as indicated by the arrow). FIG. 14 also shows an isolation characteristic (pass characteristic from the transmit terminal to the receive terminal) of a comparative example in which the connection path 13512 shown in FIG. 13A is connected to the seal ring 136. The horizontal axis of the graph of FIG. 14 denotes the frequency, and the vertical axis denotes insertion loss (degree of suppression).

The duplexer 100 according to the present embodiment, as shown in FIGS. 3A and 3B, the resonators 138 of the transmit filter 12 and the resonator 137 of the receive filter 13 are arranged side by side in the SAW propagating direction. The filter chip 129 is equipped with bumps (pads) 131 arranged so that the SAW filters 12 and 13 are interposed between the bumps 131. In other words, the bumps 131 are located further out than the resonators 137 and 138. This arrangement makes it possible to keen an appropriate distance between the adjacent bumps 131 on the filter chip 129 and improve the isolation between the transmit and receive systems. Preferably, the back surface of the filter chip 129 (opposite to the circuit-arranged surface thereof) has an appropriate roughness in order to avoid influence of the bulk wave produced in the filter chip 129. The rough back surface causes diffused reflection and reduces the interference between the transmit filter 12 and the receive filter 13.

As shown in FIG. 5, the transmit line 141 and the input portion of the phase matching circuit 11 are substantially parallel to and spaced apart from each other. Similarly, the receive line 142 and the output of the phase matching circuit 11 are substantially parallel to and spaced apart from each other. It is thus possible to keep an appropriate distance between the bumps on the filter chip 129 and to improve isolation. The flip-chip bonding pads of the input and output of the phase matching circuit 11 are diagonally arranged, so that the degree of freedom to route the phase matching line pattern can be enhanced.

In short, the duplexer 100 according to the present invention has a package that houses two SAW filters 12 and 13 having different center frequencies, and a phase matching circuit 11 that matches the phases of the SAW filters, wherein the chip 129 of the SAW filters is facedown mounted on the die-attached layer 122, and ground line patterns 147, 154; 148, 149, 150 and 155 for implementing inductances L4, L21–L23 are formed on the die-attached layer 122 and the ground layer 123 that underlies the layer 122. With this structure, the long ground lines can be formed and large inductances can be implemented without wires. Thus, the compact duplexer with high performance can be realized. The ground line thus formed may be applied to either the filter 12 or 13 or both.

In the duplexer 100, the ground wiring patterns 147, 154; 148, 149, 150 and 155 on the layers 122 and 123 are connected in series by means of the vias $60_3$, $60_2$, and $60_1$ formed in the laminate package 120, so that the ground lines run on the two layers and are long enough to obtain the target inductance values.

Figure 15:
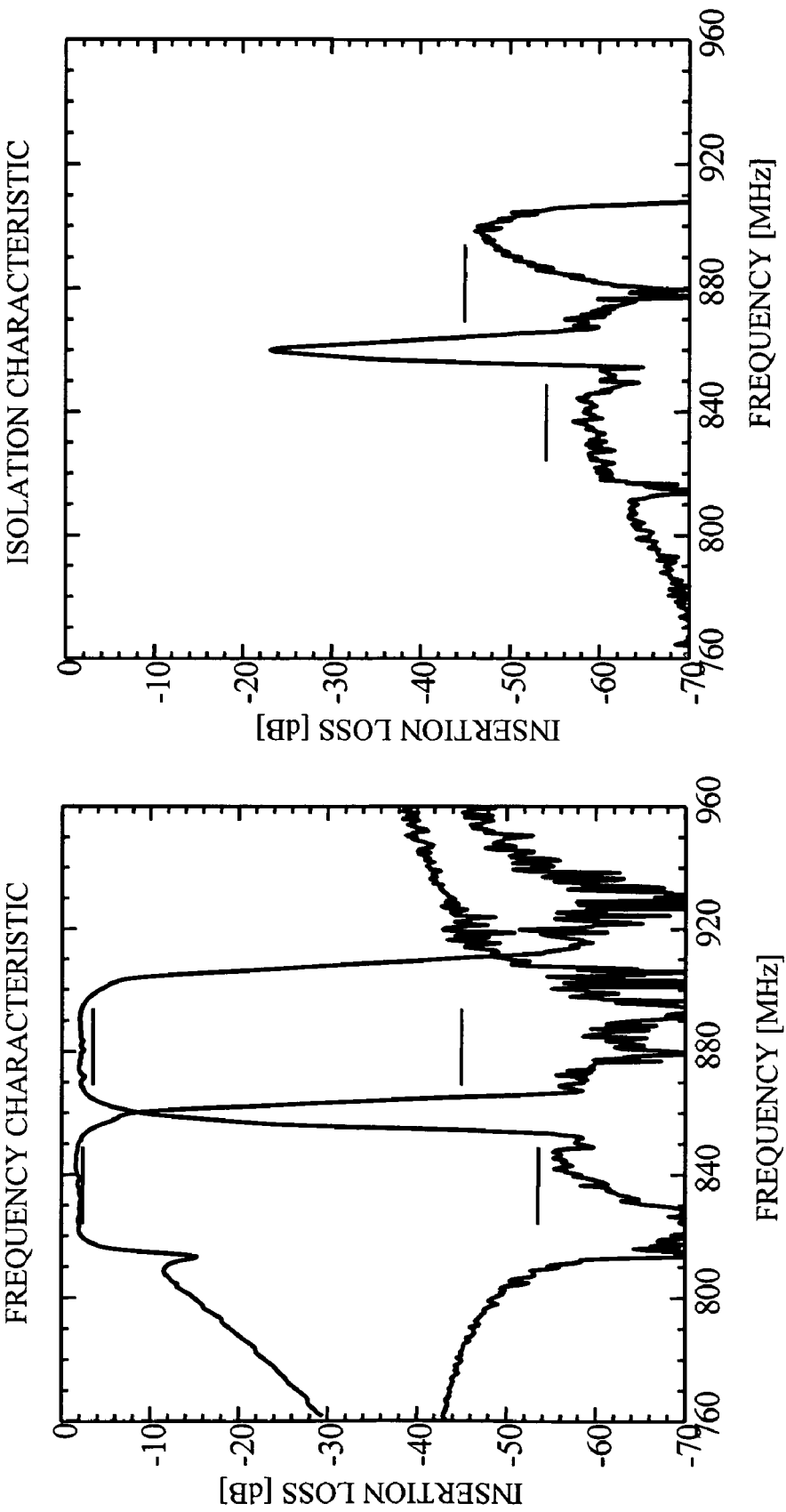
FIG. 15A is a graph of a frequency characteristic of the duplexer shown in FIG. 2.
FIG. 15B is a graph of an isolation characteristic of the duplexer shown in FIG. 2.

FIG. 15A shows frequency characteristics of the transmit filter and the receive filter of the duplexer 100, and FIG. 15B shows an isolation characteristic thereof (pass characteristic from the transmit terminal to the receive terminal). It can be seen from these graphs that the duplexer 100 has great out-of-band suppression and small insertion loss. The duplexer 200 has characteristics similar to those of FIGS. 15A and 15B.

Figure 16:
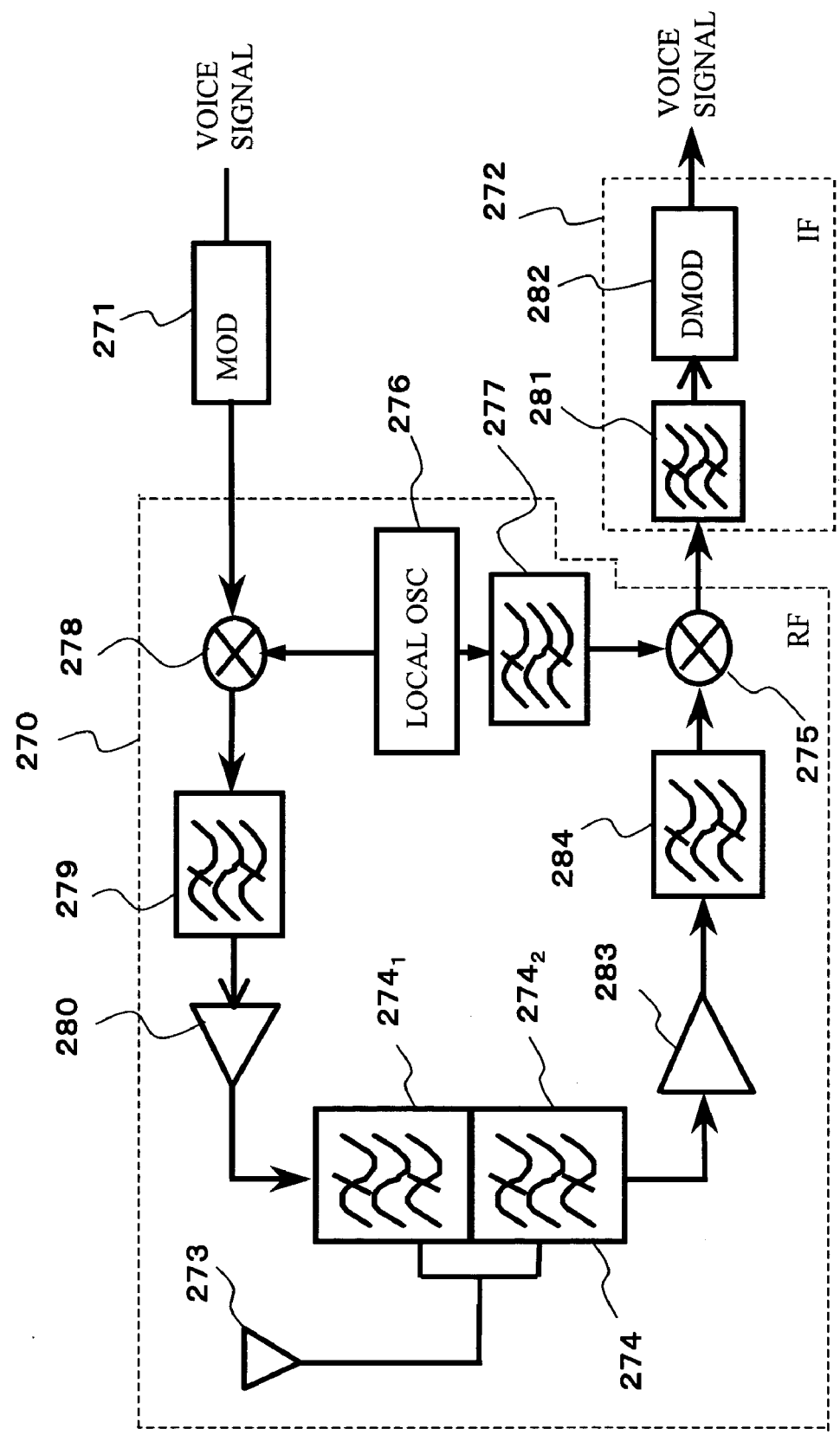
FIG. 16 is a block diagram of an electronic apparatus equipped with the duplexer according to the present invention.

FIG. 16 is a block diagram of an electronic apparatus equipped with the above-mentioned duplexer 100 or 200. The electronic apparatus is a cellular phone, and FIG. 16 shows transmit and receive systems thereof. The other structural parts such as a voice processing system of the cellular phone are omitted from FIG. 16 for the sake of simplicity.

The cellular phone has an RF (Radio Frequency) part 270, a modulator 271 and IF (Intermediate Frequency) part 272. The RF part 270 includes an antenna 273, a duplexer 274, a low-noise amplifier 283, an inter-stage filter 284, a mixer (multiplier) 275, a local oscillator 276, an inter-stage filter 277, a mixer (multiplier) 278, an inter-stage filter 279 and a power amplifier 280. A voice signal from the voice processing system is modulated by the modulator 271. The modulated signal is mixed with a local signal from the local oscillator 276 by the mixer 278 of the RF part 270. The up-converted signal of the mixer 278 thus obtained passes through the inter-stage filter 279 and the power amplifier 280, and is applied to the duplexer 274.

The duplexer 274 has a transmit filter $274_1$, a receive filer $274_2$, and a phase matching circuit (not shown), and is formed by the duplexer 100 or 200. The transmit signal from the power amplifier 280 is applied to the antennal 273 through the transmit filter $274_1$ of the duplexer 274. The receive signal from the antenna 273 passes through the receive filter $274_2$ of the duplexer 274, and is applied to the mixer 275 via the low-noise amplifier 283 and the inter-stage filter 284. The mixer 275 receives the local signal from the local oscillator 276 via the inter-stage filter 277, and mixes it with the received signal. The down-converted signal of the mixer 275 thus obtained is applied to the IF part 272, in which the modulator 282 receives the down-converted signal via the inter-stage filter 281 and demodulates it into the original voice signal.

The cellular phone shown in FIG. 16 equipped with the duplexer of the present invention has the miniaturized size and excellent filter characteristics.

The present invention is not limited to the specifically disclosed embodiments, and other embodiments, variations and modifications may be made without departing from the scope of the present invention.

The present application is based on Japanese Patent Application No. 2003-124385 filed Apr. 28, 2003, and the entire disclosure of which is hereby incorporated by reference.

What is claimed is:

1. A duplexer comprising:
two surface acoustic wave (SAW) filters having different center frequencies;
a phase matching circuit that matches phases of the two SAW filters;
a package in which the SAW filters and the phase matching circuit are housed, the package having a die-attached layer on which a chip of the SAW filters is facedown mounted; and
ground line patterns provided on the die-attached layer and an underlying layer that underlies the die-attached layer, the ground line patterns forming inductances, wherein:
the two SAW filters have a plurality of stages composed of series resonators and parallel resonators; and
one of the ground line patterns connected to one of the parallel resonators shared by two stages is longer than another one of the ground line patterns connected to another one of the parallel resonators specifically used in one of the stages.

2. The duplexer as claimed in claim 1, wherein the duplexer comprises a structure in which the ground line patterns on the die-attached layer and the underlying layer are connected by a via provided in the package.

3. The duplexer as claimed in claim 1, wherein the ground line patterns have different widths and/or lengths.

4. The duplexer as claimed in claim 1, wherein the die-attached layer has flip-chip bonding pads connected to pads on a main surface of the chip.

5. A duplexer comprising:
two surface acoustic wave (SAW) filters having different center frequencies;
a phase matching circuit that matches phases of the two SAW filters;
a package in which the SAW filters and the phase matching circuit are housed, the package having a die-attached layer on which a chip of the SAW filters is facedown mounted; and
ground line patterns provided on the die-attached layer and an underlying layer that underlies the die-attached layer, the ground line patterns forming inductances, wherein:
the package has yet another layer on which a first phase matching line pattern that forms the phase matching circuit is formed; and
the ground wiring lines include a ground wiring line that runs above the first phase matching line pattern.

6. A duplexer comprising:
two surface acoustic wave (SAW) filters having different center frequencies;
a phase matching circuit that matches phases of the two SAW filters;
a package in which the SAW filters and the phase matching circuit are housed, the package having a die-attached layer on which a chip of the SAW filters is facedown mounted; and
ground line patterns provided on the die-attached layer and an underlying layer that underlies the die-attached layer, the ground line patterns forming inductances, wherein the package comprises:

a first phase matching pattern layer on which a first phase matching line pattern of the phase matching circuit is formed;
a second phase matching pattern layer on which a second phase matching line pattern of the phase matching circuit is formed, the second phase matching pattern layer being located below the first phase matching pattern layer;
first, second and third ground patterns provided so that the first phase matching line pattern is interposed between the first and second ground patterns, and the second phase matching line pattern is interposed between the second and third ground patterns,
a distance between the first and second ground patterns being different from that between the second and third ground patterns.

7. The duplexer as claimed in claim 6, wherein the distance between the first and second ground patterns is shorter than the distance between the second and third ground patterns.

8. The duplexer as claimed in claim 6, wherein the first ground layer is interposed between the die-attached layer and the first phase matching line pattern.

9. The duplexer as claimed in claim 6, wherein the first and second phase matching line patterns have crossing portions.

10. The duplexer as claimed in claim 6, wherein the second phase matching line pattern is longer than the first phase matching line pattern.

11. A duplexer comprising:
two surface acoustic wave (SAW) filters having different center frequencies;
a phase matching circuit that matches phases of the two SAW filters;
a package in which the SAW filters and the phase matching circuit are housed, the package having a die-attached layer on which a chip of the SAW filters is facedown mounted; and
ground line patterns provided on the die-attached layer and an underlying layer that underlies the die-attached layer, the ground line patterns forming inductances,
wherein the phase matching circuit comprises a phase matching line pattern having an impedance smaller than that of an external circuit coupled to the duplexer.

12. A duplexer comprising:
two surface acoustic wave (SAW) filters having different center frequencies;
a phase matching circuit that matches phases of the two SAW filters;
a package in which the SAW filters and the phase matching circuit are housed, the package having a die-attached layer on which a chip of the SAW filters is facedown mounted; and
ground line patterns provided on the die-attached layer and an underlying layer that underlies the die-attached layer, the around line patterns forming inductances,
wherein:
the ground line patterns include a receive ground line pattern involved in a receive system of the duplexer; and
the receive ground line pattern is connected to only a ground pattern on a cap mounting layer of the package and a footpad formed on a lowermost layer of the package.

13. The duplexer as claimed in claim 12, wherein:
the ground line patterns include a transmit ground line pattern involved in a transmit system of the duplexer; and
the transmit ground line pattern is connected to the receive ground pattern via only the footpad.

14. A duplexer comprising:
a chip having first and second surface acoustic wave (SAW) filters having different center frequencies;
a phase matching circuit that matches phases of the first and second SAW filters; and
a package in which the first and second SAW filters and the phase matching circuit are housed,
resonators of the first and second SAW filters being arranged side by side in a SAW propagating direction,
the chip having pads located further out than the resonators in the SAW propagating direction.

15. A duplexer comprising:
two surface acoustic wave (SAW) filters having different center frequencies;
a phase matching circuit that matches phases of the two SAW filters;
a package in which the SAW filters and the phase matching circuit are housed, the package having a die-attached layer on which a chip of the SAW filters is facedown mounted; and
ground line patterns provided on the die-attached layer and an underlying layer that underlies the die-attached layer, the ground line patterns forming inductances,
wherein:
the phase matching circuit comprises a line pattern that runs on multiple layers of the package; and
ends of the line pattern are diagonally located on one of the multiple layers.

16. An electronic apparatus comprising:
an antenna;
a duplexer connected to the antenna; and
transmit and receive systems connected to the duplexer, the duplexer comprising:
a chip having first and second surface acoustic wave (SAW) filters having different center frequencies;
a phase matching circuit that matches phases of the first and second SAW filters; and
a package in which the first and second SAW filters and the phase matching circuit are housed,
resonators of the first and second SAW filters being arranged side by side in a SAW propagating direction,
the chip having pads located further out than the resonators in the SAW propagating direction.

17. An electronic apparatus comprising:
an antenna;
a duplexer connected to the antenna; and
transmit and receive systems connected to the duplexer, the duplexer comprising:
two surface acoustic wave (SAW) filters having different center frequencies;
a phase matching circuit that matches phases of the two SAW filters;
a package in which the SAW filters and the phase matching circuit are housed, the package having a die-attached layer on which a chip of the SAW filters is facedown mounted; and
ground line patterns provided on the die-attached layer and an underlying layer that underlies the die-attached layer, the ground line patterns forming inductances,
wherein:
the two SAW filters have a plurality of stages, composed of series resonators and parallel resonators; and
one of the ground line patterns connected to one of the parallel resonators shared by two stages is longer than another one of the around line patterns connected to another one of the parallel resonators specifically used in one of the stages.

* * * * *